United States Patent [19]
Akimoto

[11] Patent Number: 5,321,664
[45] Date of Patent: Jun. 14, 1994

[54] SEMICONDUCTOR INTEGRATED CIRCUIT DEVICE HAVING VARIOUS BLOCKS SPECIFICALLY ARRANGED ON A SINGLE SEMICONDUCTOR SUBSTRATE FOR HIGH SPEED OPERATION

[75] Inventor: Kazuhiro Akimoto, Tokorozawa, Japan

[73] Assignee: Hitachi, Ltd., Tokyo, Japan

[21] Appl. No.: 464,032

[22] Filed: Jan. 12, 1990

[30] Foreign Application Priority Data

Jan. 16, 1989 [JP] Japan ................................ 1-7282

[51] Int. Cl.$^5$ .............................................. G11C 7/00
[52] U.S. Cl. .............................. 365/230.03; 365/233; 365/63; 365/51
[58] Field of Search ............... 365/51, 63, 189.08, 365/230.03, 194, 195, 233

[56] References Cited
U.S. PATENT DOCUMENTS 4,791,607 12/1988 Igarashi et al. .................... 365/51
4,945,513 7/1990 Ueda .................................... 365/51
5,023,835 6/1991 Akimoto et al. .................. 365/155

FOREIGN PATENT DOCUMENTS 58-60487 4/1983 Japan .

Primary Examiner—Joseph A. Popek
Attorney, Agent, or Firm—Fay, Sharpe, Beall, Fagan, Minnich & McKee

[57] ABSTRACT

A semiconductor integrated circuit device formed with a single semiconductor substrate has, in one embodiment, an input buffer for receiving an input signal, memory blocks each producing an output signal responsive to the input signal and an output data selecting circuit for selectively transferring an output of one or more of the memory blocks. The input buffer, memory blocks and output data selecting circuit are arranged on the single semiconductor substrate in an order of progress of signal processing operations to be performed in the semiconductor integrated circuit device.

38 Claims, 8 Drawing Sheets

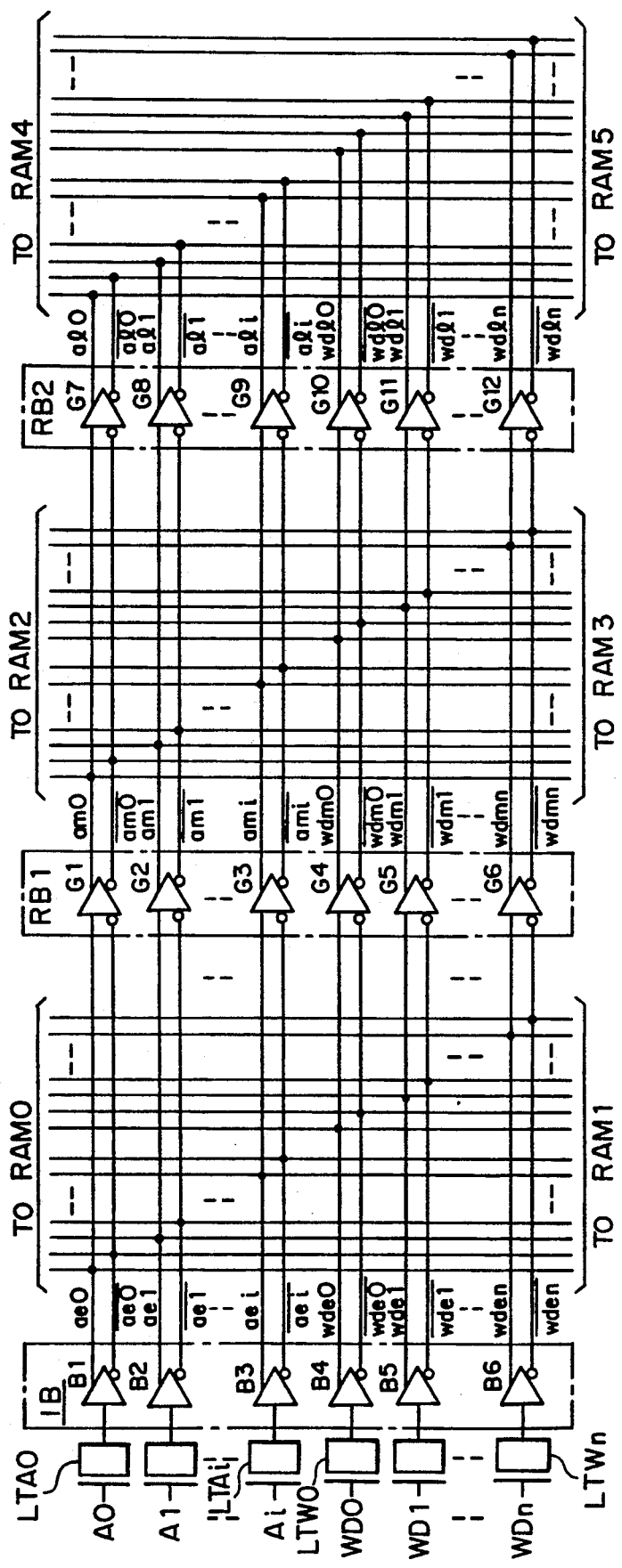
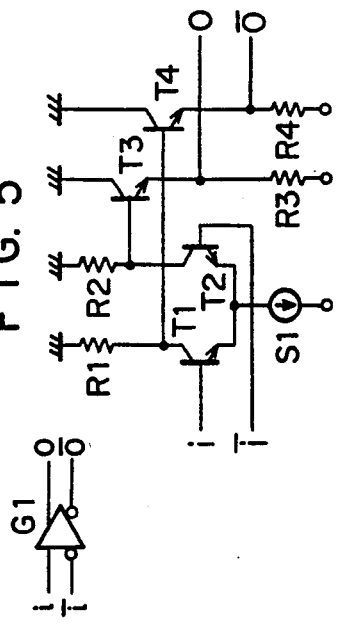
FIG. 4
FIG. 5

SEMICONDUCTOR INTEGRATED CIRCUIT DEVICE HAVING VARIOUS BLOCKS SPECIFICALLY ARRANGED ON A SINGLE SEMICONDUCTOR SUBSTRATE FOR HIGH SPEED OPERATION

BACKGROUND OF THE INVENTION

The present invention relates to a semiconductor integrated circuit device, and in particular to a technique which is especially effective in application to ASIC (application specific integrated circuits) memories comprising a plurality of bipolar transistor RAMs (random access memories) as basic constituents, for example. Bipolar transistor RAMs (hereafter referred to as bipolar RAMs) comprising bipolar transistor memory cells and cascade-connected ECL (emitter coupled logic) gate circuits (custom gates) as basic constituents are known. Further, there are also known ASIC memories comprising a combination of such bipolar RAMs and predetermined logic blocks.

Bipolar RAMs are described in JP-A-58-60487 published on Apr. 9, 1983, for example.

A semiconductor memory device comprising a plurality of RAM blocks and logic circuit blocks disposed near the RAM blocks is disclosed in U.S. Pat. No. 5,023,835 issued Jun. 11, 1991 and assigned to the same assignee as the present application and, which is a continuation application of U.S. patent application Ser. No. 13,550 filed on Nov. 2, 1987 and now abandoned.

In advance of the present invention, the present inventors developed an ASIC memory device as shown in FIG. 1. In FIG. 1, the ASIC memory device comprises six random access memories RAM0 to RAM5 comprising bipolar RAMs formed on one semiconductor substrate SUB, an input buffer IB1 for receiving a read selecting signal RS0-RS5 and a write selecting signal WS0-WS5 and generating an internal read selecting signal rs0-rs5 and an input write selecting signal ws0-ws5, an internal buffer IB2 for receiving an address signal A0-Ai and generating an internal address signal a0-ai, an input buffer IB3 for receiving a write data signal WD0-WDn and generating an internal write signal Wd0-Wdn, and an output data selecting circuit DSL for selectively outputting an output signal rd00-rd0n, rd10-rd1n, . . . , rd50-rd5n as a memory output signal RD0-RDn responsive to the internal read selecting signal rs0-rs5. On the substrate SUB, the input buffers IB1-IB3 are disposed nearly halfway between a side of the substrate where the input signals RS0-RS5, WS0-WS5, A0-Ai and WD0-WDn, and received and another side of the substrate where the memory output signal RD0-RDn is outputted, i.e., the input buffers IB1-IB3 are disposed nearly in the center of the arrangement of the random access memories RAM0-RAM5. The random access memory RAM0 RAM5 is started by the internal address signal a0-ai to start a predetermined read operation. Further, a corresponding internal write selecting signal ws0-ws5 is alternatively set at a high level to execute a predetermined write operation. In this ASIC memory device, the above described input buffers IB1-IB3 are disposed in the center of the random access memories RAM0-RAM5 as described above. Therefore, variations in propagation delay time taken for the input signals such as the address signal A0-Ai to reach respective random access memories are limited. The overall access time of the ASIC memory device is thus shortened equivalently.

As the performance of the digital system comprising an ASIC memory device is raised and an increase in storage capacity and a higher speed are demanded upon the ASIC memory device, it has been made clear that the following problems occur in the above described ASIC memory device. That is to say, in the above described ASIC memory, the input buffers IB1-IB3 for transferring the input signals such as the read selecting signal, the write selecting signal, the address signal and the write data signal are disposed in the center of the random access memories RAM0-RAM5 as described before. In the central portion of the ASIC memory device, therefore, an area having concentrated signal conductors is generated, and layout design for the memory device becomes complicated. Further, since respective signals are transferred via signal conductors which are not necessarily disposed in order of progress of signal processing operations, the overall signal conductor length of the ASIC memory device is increased and the propagation delay time is also increased. Further, there still remain variations in propagation delay time taken for input signals to reach respective random access memories. On the other hand, variations in propagation delay time taken for output signals of respective random access memories to reach the output data selecting circuit DSL tend to, on the contrary, increase because of the above described arrangement of the input buffers.

As shown in FIG. 2, access time $t_{AC}$ of this ASIC memory device is equivalent to the sum of the maximum value $t_{ADX}$ of address signal propagation delay time taken for the address signal to reach the random access memory RAM0-RAM5, the maximum value $t_{RAX}$ of RAM access time elapsing from the time when the internal address signal a0-ai is inputted to the random access memory RAM0-RAM5 until the time when the signal read out from the RAM0-RAM5 becomes valid, and the maximum value $t_{ODX}$ of output data propagation delay time taken for the output signal of the random access memory RAM0-RAM5 propagating to the output terminal of the output data selecting circuit DSL. Since variations still remain in the propagation delay time of respective signals and the overall delay time value is increased as described before, shortening of the access time $t_{AC}$ of the ASIC memory device is limited. As a result, enhancement in performance of a digital system comprising an ASIC memory device is limited.

SUMMARY OF THE INVENTION

An object of the present invention is to provide a semiconductor integrated circuit device comprising a plurality of function blocks formed in a single semiconductor substrate and having a structure suited to high-speed operation.

Another object of the present invention is to raise the operation speed of an ASIC memory device comprising a plurality of function blocks and enhance the performance of a digital system comprising an ASIC memory device.

According to one aspect of the present invention, a semiconductor integrated circuit device formed with a single semiconductor substrate comprises an input stage for receiving a first input signal and delivering a second input signal corresponding to the first input signal, a plurality of function blocks each electrically connected with the input stage to operate to generate an output signal responsive to the second input signal, and an output stage electrically connected with the function blocks to receive the output signal of the each function block for producing a device output signal, in which the input stage, function blocks and output stage are arranged on the single semiconductor substrate in an order of progress of signal processing operations to be performed in the semiconductor integrated circuit device.

In one embodiment of the present invention, the length of a conductor for the electrical connection of any one of the function blocks with the input stage is smaller than that for the electrical connection of another one of the function blocks with the input stage, the another function block being generally located more distance from the input stage than the one function block on the single substrate so that the function blocks are brought into operation responsive to the second input signal in the ascending order of the lengths of the conductors for the electrical connection of the input stage with the function blocks, namely, the function blocks generally arranged relatively nearer to the input stage are brought into operation earlier than those generally arranged relatively not nearer to the input stage. Further, the length of conductor for the electrical connection of the one function block with the output stage is larger than that for the electrical connection of the another function block with the output stage, the one function block being generally more distant from the output stage than the another function block on the single substrate so that a time necessary for the output signal generated by the one function block to propagate on the conductor to reach the output stage is longer than that for the output signal generated by the another function block. Thereby, a sum of a first period of time taken for the second address signal propagating from the input stage to reach one function block and a second period of time taken for the output signal of that one memory block propagating therefrom to the output stage is substantially the same for all of the plurality of function blocks.

According to another aspect of the present invention, a semiconductor memory device formed with a single semiconductor substrate comprises an input buffer for converting a first address signal to a second address signal, a plurality of memory blocks each electrically connected with the input buffer so that each of them delivers an output signal responsive to the second address signal, at least one internal amplifier for amplifying the second address signal, and a logic circuit electrically connected with the memory blocks to receive the output signal of the each memory block for producing a device output signal, in which the input buffer, memory blocks, at least one internal amplifier and logic circuit are arranged on the single semiconductor substrate in an order of progress of signal processing operations to be performed in the semiconductor memory device. The at least one internal amplifier is connected to supply the amplified second address signal to any of those of the memory blocks preceded by the buffer amplifier as viewed in the direction of the progress of signal processing operations in the memory device so that the memory blocks Preceded by the internal amplifier are connected with the input buffer through the internal amplifier.

The above described structure makes it possible to average and compress variations in propagation delay time taken since input signals such as the address signal are inputted to a semiconductor IC device such as a semiconductor memory device until output signals of respective function blocks such as memory blocks become valid at the output stage of the device. The above described structure also makes it possible to shorten the overall propagation delay time of a signal in the device. Therefore, the response time of the device can be equivalently shortened and the performance of a digital system comprising an ASIC memory device or the like, for example, can be enhanced.

BRIEF DESCRIPTION OF THE DRAWINGS

FIG. 4 is a circuit diagram for exemplifying an input buffer and repeating buffers included in the ASIC memory device of FIG. 3.

FIG. 5 is a circuit diagram showing an example of a buffer gate circuit included in the repeating buffer of FIG. 4.

DESCRIPTION OF THE PREFERRED EMBODIMENTS

Semiconductor integrated circuit devices according to the present invention will hereafter be described by taking an ASIC memory device as an example. However, it is evident that the present invention is not limited to this, but is applicable to other semiconductor IC devices as well. For example, a memory block is used as the function element in preferred embodiments which will hereafter be described. Instead, however, a logic gate, a combination of a plurality of logic gates, or another function element may also be used.

Figure 3:
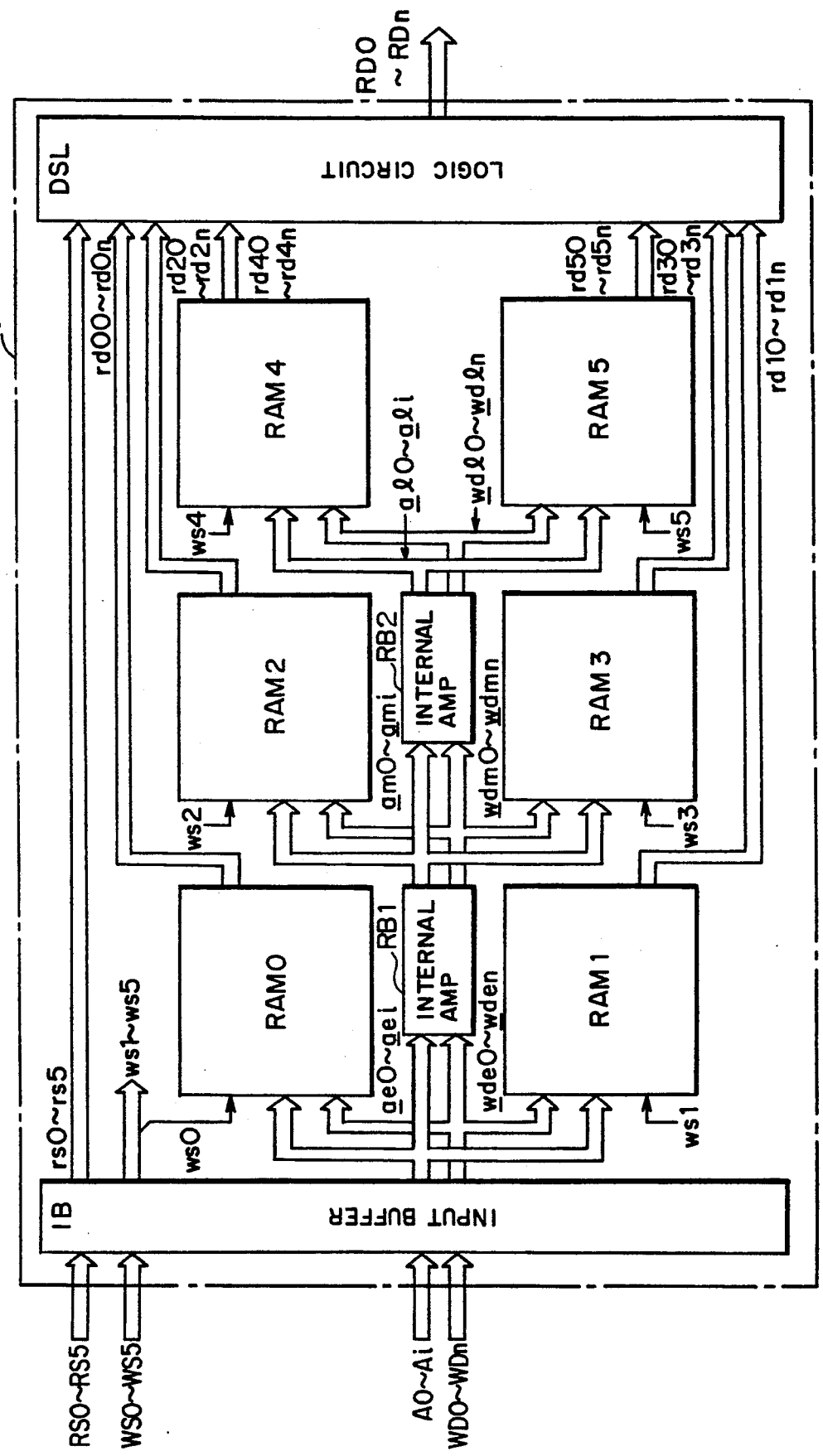
FIG. 3 is a diagram showing an ASIC memory device according to a preferred embodiment of the present invention.
Figure 6:
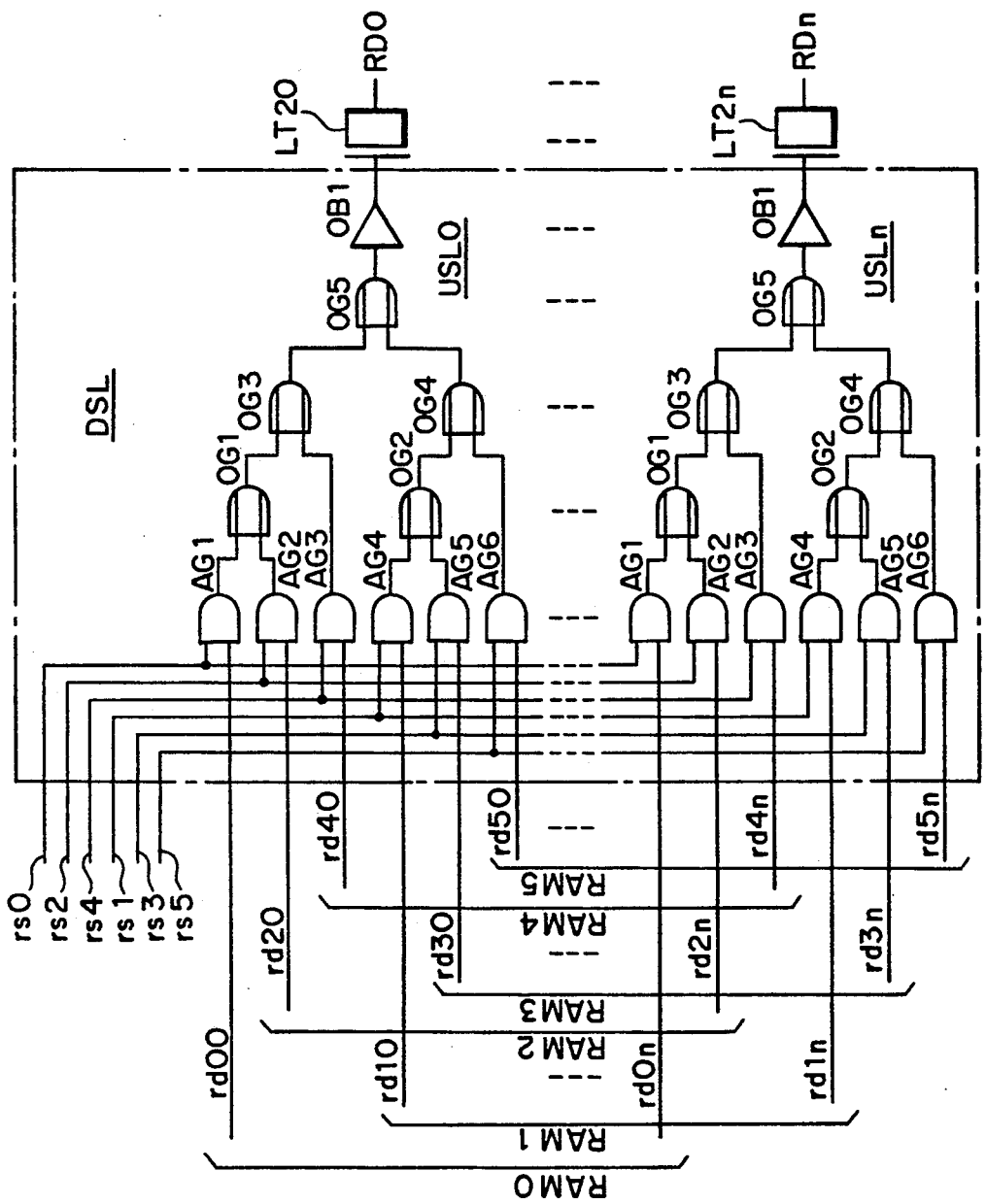
FIG. 6 is a circuit diagram showing an example of an output data selecting circuit included in the ASIC memory device of FIG. 3.
Figure 7:
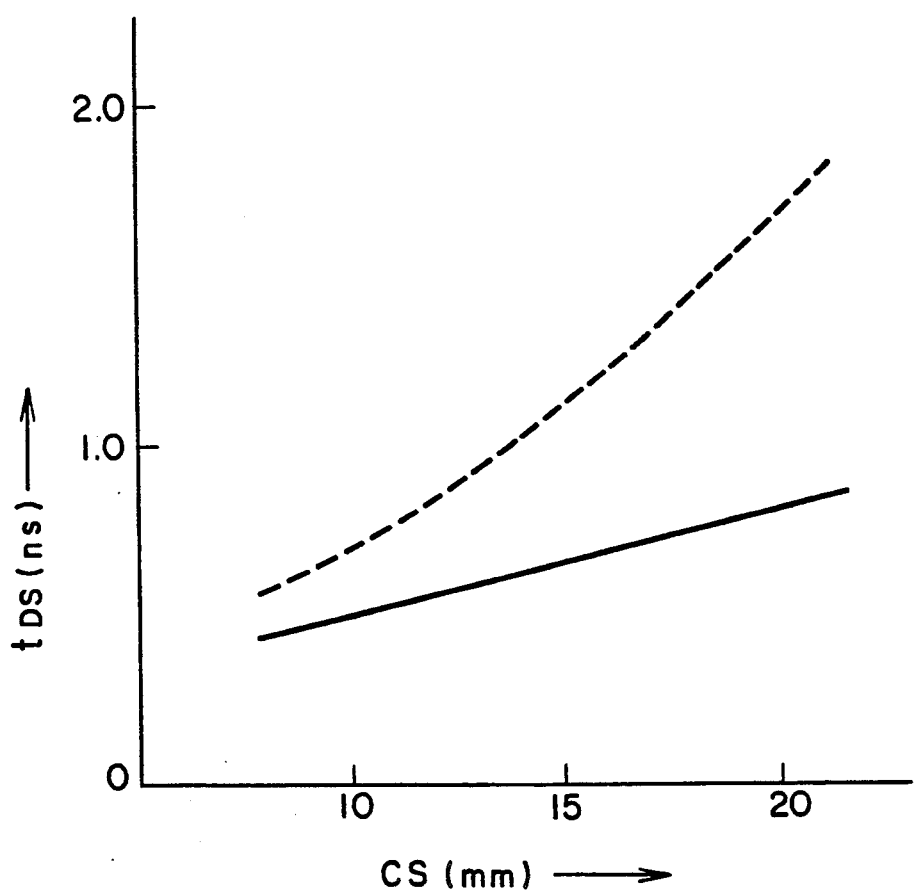
FIG. 7 is a characteristic diagram showing the relationship between the chip size of the ASIC memory device of FIG. 3 and the overall propagation delay time of its signal.
Figure 8:
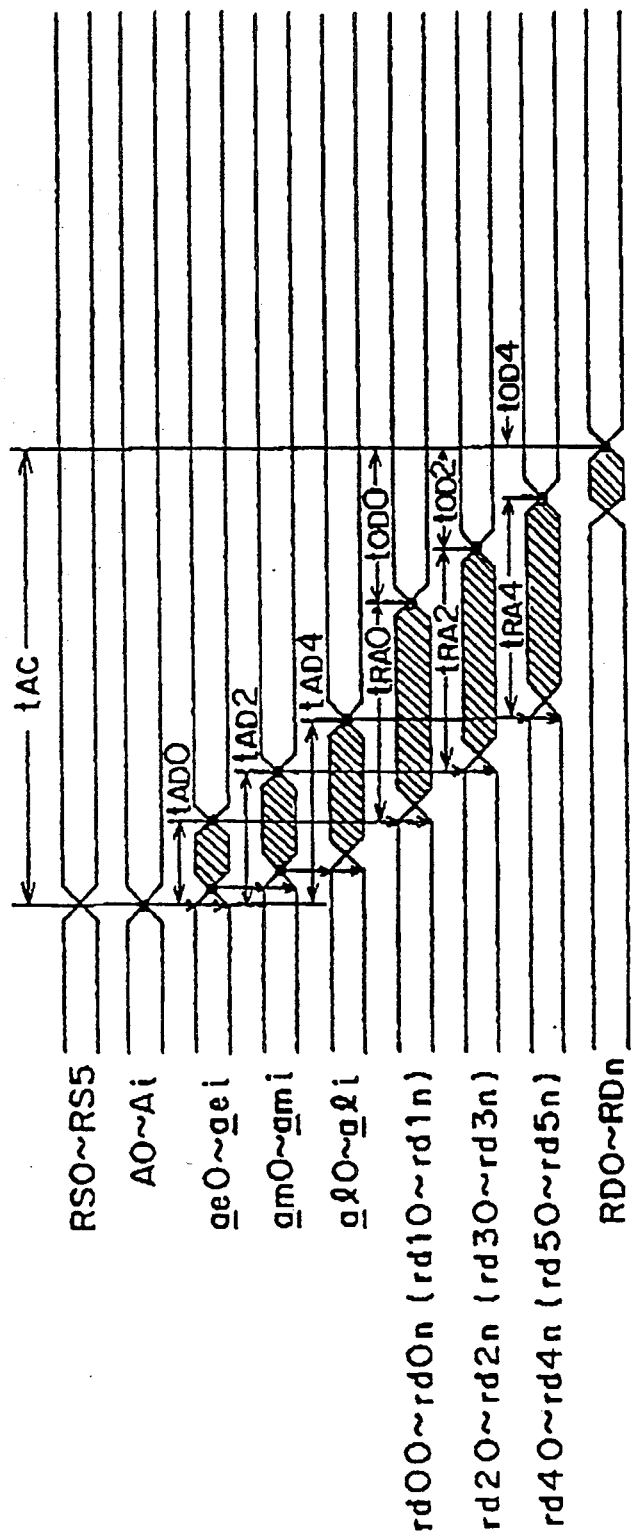
FIG. 8 is a timing diagram showing an example of a read operation of the ASIC memory device of FIG. 3.

FIG. 3 shows an ASIC memory device according to a preferred embodiment of the present invention. Further, FIG. 4 is a circuit diagram exemplifying an input buffer IB and repeating buffers RB1 and RB2. FIG. 6 is a circuit diagram of an example of a logic circuit DSL used in the ASIC memory device of FIG. 3. FIG. 5 is a circuit diagram of an example of a buffer gate circuit G1 included in repeating buffers or relay buffers RB1 and RB2 of FIG. 4. Further, FIG. 7 is a characteristic diagram showing the relationship between the chip size CS of the ASIC memory device of FIG. 3 represented in terms of the length of one side of the chip and the overall propagation delay time $t_{DS}$ of its signal. FIG. 8 is a timing diagram of an example of a read operation of the ASIC memory device shown in FIG. 3. By referring to these drawings, the structure, outline of operation and features of the ASIC memory device of this embodiment will now be described. Although circuit elements forming respective blocks of FIG. 3 are not especially restricted, they are formed in a single semiconductor substrate 10 such as monocrystalline silicon.

Although the ASIC memory device of this embodiment is not especially restricted, it comprises six function elements, i.e., six random access memory blocks RAM0-RAM5 (each comprising a memory cell array, for example) which are so disposed as to occupy the greater part of the area of the semiconductor substrate 10. These random access memory blocks comprise, for example, bipolar RAMs each having a cascade-connected ECL gate circuit or an ordinary ECL gate circuit (custom gate) as the basic constituent and each having the so-called multibit structure in which storage data are inputted/outputted by taking n bits as the unit. In response to an address signal A0-Ai having i+1 bits supplied from an external device which is not illustrated or a certain logic circuit block formed in the same semiconductor substrate via an input buffer IB included in the input stage or via the input buffer IB and at least one repeating buffer or relay buffer (internal amplifier), the memory blocks RAM0 RAM5 are started in parallel to begin read operation, for example. As a result, signals each having n+1 bits read out from respective memory blocks reach a logic circuit DSL forming the output stage such as an output data selecting circuit. Thereafter, those signals undergo selection depending upon a read selecting signal RS0 RS5. The signal thus selected is outputted alternatively as a read data signal RD0-RDn. When a corresponding write selection signal WS0-WS5 is changed to a high level, the memory blocks RAM0-RAM5 alternatively execute a write operation. A write data signal WD0-WDn having n+1 bits supplied from an external device which is not illustrated or another logic circuit block formed in the same semiconductor substrate is thus written into n+1 selected memory cells in a selected memory block The input buffer IB, the memory blocks RAM-0-RAM5 and the logic circuit DSL are arranged on the substrate 10 in order of progress of signal processing operations to be executed by the ASIC memory device as hereafter described.

In FIG. 3, input signals supplied from, for example, an external device which is not illustrated (an external logic LSI device), i.e., the read selecting signal RS0-RS5, the write selecting signal WS0-WS5, the address signal A0-Ai, and the write data signal WD0-WDn are inputted to the input buffer IB via corresponding input nodes of the ASIC memory device.

Although not especially, restricted, the input buffer IB comprises a plurality of input buffer circuits B1-B6 so disposed as to correspond to the above described respective input signals as exemplified in FIG. 4. Although not illustrated, the input buffer circuits for handling the read selecting signal and the write selecting signal are similar to the circuits B1-B6. In the same way as a buffer gate circuit which will be described later, each of these input buffer circuits comprises a pair of differential transistors as the basic constituent. On the basis of the corresponding read selecting signal RS0-RS5, write selecting signal WS0-WS5, address signal A0-Ai, and write data signal WD0-WDn, these input buffer circuits form an internal read selecting signal rs0-rs5 and an internal write selecting signal ws0-ws5, which have undergone level conversion, as well as a complementary internal address signal ae0-aei and complementary internal write data wde0-wden, where, for example, a non-inverted internal address signal ae0 and its inverted internal address signal $\overline{ae0}$ are collectively represented as a complementary internal address signal ae0. The same notation applies to other signals. Among the above described signals, the internal read selecting signal rs0-rs5 is supplied to the output data selecting circuit DSL, whereas the internal write selecting signal ws0-ws5 is supplied to the corresponding memory block RAM0-RAM5. Further, the complementary internal address signal ae0-aei and the complementary internal write data wde0-wden are supplied to two memory blocks RAM0 and RAM1 as well as the repeating buffer (internal amplifier) RB1.

In this embodiment, a plurality of buffer circuits comprising B1-B6 included in the above described input buffer IB are disposed on the most upstream side of the signal flow in the substrate 10. For example, the plurality of buffer circuits are disposed collectively at one end of the semiconductor substrate in which the above described memory blocks RAM0-RAM5 are formed.

Although not especially restricted, the repeating buffer (relay buffer) RB1, i.e., the internal amplifier RB1 for amplifying the internal address signal ae0 aei and the internal write data signal wde0-wden comprises i+1 buffer gate circuits G1-G3 so disposed as to correspond to the above described complementary internal address signals ae0-aei and n+1 buffer gate circuits G4-G6 so disposed as to correspond to the above described complementary internal write data wde0-wden as shown in FIG. 4. As represented by the buffer gate G1 of FIG. 5, for example, each of these buffer gate circuits G1-G3 and G4-G6 comprises a current switch circuit and two output emitter follower circuits. The current switch circuit comprises differential transistors T1 and T2, load resistors R1 and R2 of the transistors T1 and T2, and a constant current source S1 connected to emitters of the transistors T1 and T2 which are connected together. The two output emitter follower circuits comprise a transistor T3 receiving the output of the transistor T2, a load resistor R3 of the transistor T3, a transistor T4 receiving the output of the transistor T1, and a load resistor R4 of transistor T4. Bases of the differential transistors T1 and T2 are used as a non-inverting input terminal i and an inverting input terminal $\overline{i}$ of each buffer gate circuit, respectively. Emitters of the transistors T3 and T4 are used as a non-inverting output terminal o and an inverting output terminal $\overline{o}$ of each buffer gate circuit, respectively. Although not illustrated in FIG. 3, a latch circuit comprising i+1 latches LTA0-LTAi and n+1 latches LTW0-LTWn as shown in FIG. 4 is located at a stage preceding the input buffer IB. This latch circuit functions to take each input signal into the device at first timing so that bits of the input signal have the same phase.

Referring back to FIG. 3, output signals of the repeating buffer (relay buffer) RB1 are supplied to the memory, blocks RAM2 and RAM3 as a complementary internal address signal am0-ami and a complementary internal write data wdm0-wdmn, respectively. The output signals of the repeating buffer RB1 are supplied to the repeating buffer RB2 as well.

Although not especially restricted, a repeating buffer (relay buffer) RB2, i.e., an internal amplifier RB2 for amplifying the internal address signal am0-ami and the internal write data signal wdm0-wdmn comprises i+1 buffer gate circuits G7-G9 so disposed as to correspond to the above described complementary internal address signals am0-ami and n+1 buffer gate circuits G10-G12 so disposed as to correspond to the above described complementary internal write data wdm0-wdmn as shown in FIG. 4 in the same way as the above described repeating buffer RB1. Each of these buffer gate circuits G7-G9 and G10-G12 may have the same circuit structure as that of each of the buffer gate circuits G1-G3 and G4-G6 of the above described repeating buffer RB1.

Referring back to FIG. 3, output signals of the repeating buffer RB2 are supplied to two memory blocks RAM4 and RAM5 as a complementary internal address signal al0-ali and complementary internal write data wdl0-wdln.

As described before, each of the memory blocks RAM0-RAM5 comprises a bipolar RAM having an (n+1)-bit structure. The memory blocks RAM-0-RAM5 are started by the address signals A0-Ai, i.e., the above described complementary internal address signals ae0-aei, am0-ami, and al0-ali, respectively. Cell selecting operation is thus started. When the above described corresponding internal write selecting signals ws0-ws5 are not set at the high level, signals read out are outputted to the logic circuit DSL as internal read data rd00-rd0n through rd50-rd5n. When the above described corresponding internal write selecting signal ws0-ws5 is alternatively set at the high level, the memory block RAM0-RAM5 alternatively executes a write operation. The above described write data WD0-WDn, i.e., the corresponding complementary internal write data wde0-wden, wdm0-wdmn, or wdl-wdln is thus written into n+1 memory cells selected by the address signal A0-Ai.

In this embodiment, the memory blocks RAM0 and RAM1 are so located as to be the closest to the input buffer IB for receiving the input signal. Succeedingly, the memory blocks RAM2 and RAM3 are located more distant from the input buffer IB than the memory blocks RAM0 and RAM1. The memory blocks RAM4 and RAM5 are located more distant from the input buffer IB than the memory blocks RAM2 and RAM3. On the substrate 10, therefore, the length of a conductor for the electrical connection of RAM2 and RAM3 with the input buffer IB is larger than that for the electrical connection of RAM0 and RAM1 with the input buffer IB. Further, the length of a conductor for the electrical connection of RAM4 and RAM5 with the input buffer IB is larger than that for the electrical connection of RAM2 and RAM3 with the input buffer IB. The repeating buffer RB1 is so disposed as to be sandwiched between the memory blocks RAM0 and RAM1, and the repeating buffer RB2 is so disposed as to be sandwiched between the memory blocks RAM2 and RAM3. More generally, the repeating buffers RB1 and RB2 are so connected and disposed as to supply internal input signals (i.e., the address signal and the write data signal) to memory blocks preceded by the input buffer as viewed in the direction of the progress of signal processing operations in the memory device. Therefore, the memory blocks preceded by the repeating buffer are connected with the input buffer through the repeating buffer. As shown in FIG. 8, therefore, the above described complementary internal address signal ae0-aei reaches the corresponding memory blocks RAM0 and RAM1 after a relatively short propagation delay time $t_{AD0}$ with respect to the address signal A0-Ai supplied from the external device. The complementary internal address signal am0-ami reaches the corresponding memory blocks RAM2 and RAM3 after a propagation delay time $t_{AD2}$ which is longer than $t_{AD0}$. The complementary internal address signal al0-ali reaches the corresponding memory blocks RAM4 and RAM5 after propagation delay time $t_{AD4}$ which is longer than $t_{AD2}$. In the ASIC memory device of this embodiment, therefore, the two memory blocks RAM0 and RAM1 so located as to be the closest to the input stage, i.e., the input buffer IB are activated first of all in accordance with the address signal A0-Ai. Succeedingly, the two memory blocks RAM2 and RAM3 are activated. Thereafter, the two memory blocks RAM4 and RAM5 are activated.

The readout signals each having n+1 bits outputted from the memory blocks RAM0-RAM5 are supplied to the logic block of the ASIC memory device such as the output data selecting circuit DSL respectively as the internal read data rd00-rd0n through rd50-rd5n.

As shown in FIG. 6, for example, the output data selecting circuit DSL comprises n+1 selectors USL0-USLn. As represented by the selector USL0, each of these selectors comprises six AND gate circuits AG-1-AG6, five OR gate circuits OG1-OG5, and one output buffer circuit OB1. The internal read data rd00-rd0n, rd20-rd2n, rd40-rd4n, rd10-rd1n, rd30-rd3n and rd50-rd5n respectively outputted from the memory blocks RAM0, RAM2, RAM4, RAM1, RAM3 and RAM5 are supplied to first input terminals of the AND gate circuits AG1, AG2, AG3, AG4, AG5 and AG6 of the selector USL0. The above described corresponding internal read selecting signals rs0, rs2, rs4, rs1, rs3 and rs5 are supplied to remaining input terminals of the AND gate circuits of the selector USL0.

Output signals of AND gate circuits AG1 and AG2 of the selector USL0 are supplied to input terminals of the OR gate circuit OG1. Further, the output signal of the AND gate circuit AG3 is supplied to one input terminal of the OR gate circuit OG3. The other input terminal of this OR gate circuit OG3 is supplied with the output signal of the above described OR gate circuit OG1. The output signal of the OR gate circuit OG3 is supplied to one input terminal of the OR gate circuit OG5. Output signals of the AND gate circuits AG4 and AG5 of the selector USL0 are supplied to input terminals of the OR gate circuit OG2. Further, the output signal of the AND gate circuit AG6 is supplied to one input terminal of the OR gate circuit OG4. The other input terminal of this OR gate circuit OG4 is supplied with the output signal of the above described OR gate circuit OG2. The output signal of the OR gate circuit OG4 is supplied to the other input terminal of the above described OR gate circuit OG5. In case of the selector USL0, the output signal of the OR gate circuit OG5 is outputted as the first bit RD0 of read data of the ASIC memory device via a corresponding output buffer circuit OB1.

Each of the selectors USL1-USLn also has the same structure as that of the selector USL0 excepting that the second to the n-th bits of the internal read data signals rd00-rd0n, rd20-rd2n, ..., rd50-rd5n supplied from the RAM0, RAM2, ..., RAM5 are inputted to first input terminals of AG1-AG6, respectively. The internal read selecting signals rs0, rs2, rs4, rs1, rs3, rs5 are supplied in common to the other input terminals of the AND gate circuits AG1-AG6, respectively.

That is to say, in the ASIC memory device of this embodiment, each of the selectors USL0-USLn included in the output data selecting circuit DSL comprises a plurality of stages of logic gate circuits. Output signals of the memory blocks RAM0 and RAM1, which are so located as to be the closest to the input buffer IB but which are located the most distant from the output data selecting circuit DSL, i.e., the internal read data rd00-rd0n and rd10-rd1n are inputted to the AND gate circuits AG1 and AG4. Output signals of the memory blocks RAM2 and RAM3, i.e., the internal read data rd20-rd2n and rd30 rd3n are inputted to the AND gate circuits AG2 and AG5 connected to logical sum circuits of a succeeding stage. Output signals of the memory blocks RAM4 and RAM5, i.e., the internal read data rd40-rd4n and rd50-rd5n are inputted to the AND gate circuits AG3 and AG6 connected to logical sum circuits of a further succeeding stage. (In the embodiment of FIG. 6, the AND gate circuits AG1 and AG2 and the AND gate circuits AG4 and AG5 are coupled to the logical sum circuits OG1 and OG2 of the second stage, respectively. In order to make the arrival time of input signals to the circuit DSL substantially uniform, predetermined delay gate circuits may be inserted between the output terminal of the AND gate circuit AG1 and one input terminal of the OR gate circuit OG1 and between the output terminal of the AND gate circuit AG4 and one input terminal of the OR gate circuit OG2.) As shown in FIG. 8, therefore, output data propagation delay time $t_{OD0}$ elapsing since the read signal of the memory blocks RAM0 and RAM1, i.e., the internal read data rd00-rd0n and rd10-rd1n become valid until the output signal of the output data selecting circuit DSL, i.e., the read data RD0-RDn becomes valid becomes relatively large because the length of a signal conductor for the electrical connection of the memory block RAM0-RAM1 with the circuit DSL is the longest. Output data propagation delay time $t_{OD2}$ for the read signal of the memory blocks RAM2 and RAM3, i.e., the internal read data rd20-rd2n and rd30-rd3n is shorter than $t_{OD0}$ because the length of the signal conductor for the electrical connection of the memory block RAM2-RAM3 with the circuit DSL becomes shorter than that for the electrical connection of the memory block RAM0-RAM1 with the circuit DSL. Further, output data propagation delay time $t_{OD4}$ for the read signal of the memory blocks RAM4 and RAM5, i.e., the internal read data rd40-rd4n and rd50-rd5n is shorter than $t_{OD2}$ because the length of a signal conductor for the electrical connection of the memory block RAM4-RAM5 with the circuit DSL becomes shorter than that for the electrical connection of the memory block RAM2-RAM3 with the circuit DSL.

In this embodiment, the above described output data selecting circuit DSL is located opposite to the input buffer IB with respect to the memory blocks RAM0-RAM5 as shown in FIG. 3. Paying attention to the layout of the ASIC memory device of this embodiment, therefore, the input buffer IB, the repeating buffers RB1 and RB2, the memory blocks RAM0-RAM5, and the logic circuit DSL are successively arranged on the substrate 10 along the logical flow of signals, i.e., from the left side of FIG. 3 to the right side in order of progress of signal processing operations to be executed by the memory device.

It is now assumed that transfer times elapsing since the address signals A0-Ai are supplied to the input buffer IB until read signals of the memory blocks RAM0/RAM1, RAM2/RAM3 and RAM4/RAM5 are transferred to the output data selecting circuit DSL and outputted as the output signal of the ASIC memory device, i.e., as the read data signal RD0-RDn are $t_{D0}$, $t_{D2}$ and $t_{D4}$, respectively. Assuming further that access times of the memory blocks RAM0/RAM1, RAM2/RAM3 and RAM4/RAM5 are $t_{RA0}$, $t_{RA2}$ and $t_{RA4}$, respectively, the following relations hold true.

$$t_{D0} \approx t_{AD0} + t_{RA0} + t_{OD0}$$
$$t_{D2} \approx t_{AD2} + t_{RA2} + t_{OD2}$$
$$t_{D4} \approx t_{AD4} + t_{RA4} + t_{OD4}$$

These transfer times $t_{D0}$, $t_{D2}$ and $t_{D4}$ nearly satisfy the following relation.

$$t_{D0} \approx t_{D2} \approx t_{D4}$$

As a matter of course, these transfer times $t_{D0}$, $t_{D2}$ and $t_{D4}$ are nothing but access time $t_{AC}$ of the ASIC memory device. That is to say, variations in propagation delay time taken for the address signal A0-Ai to propagate on signal conductors and reach input terminals of the memory blocks RAM0-RAM5, variations in access time of respective memory blocks, and variations in propagation delay time taken for output signals of respective memory blocks to propagate on signal conductors and reach the output terminal of the output data selecting circuit DSL are compressed while they are being averaged. As a result, the access time $t_{AC}$ of the ASIC memory device is shortened on an average.

Figure 1:
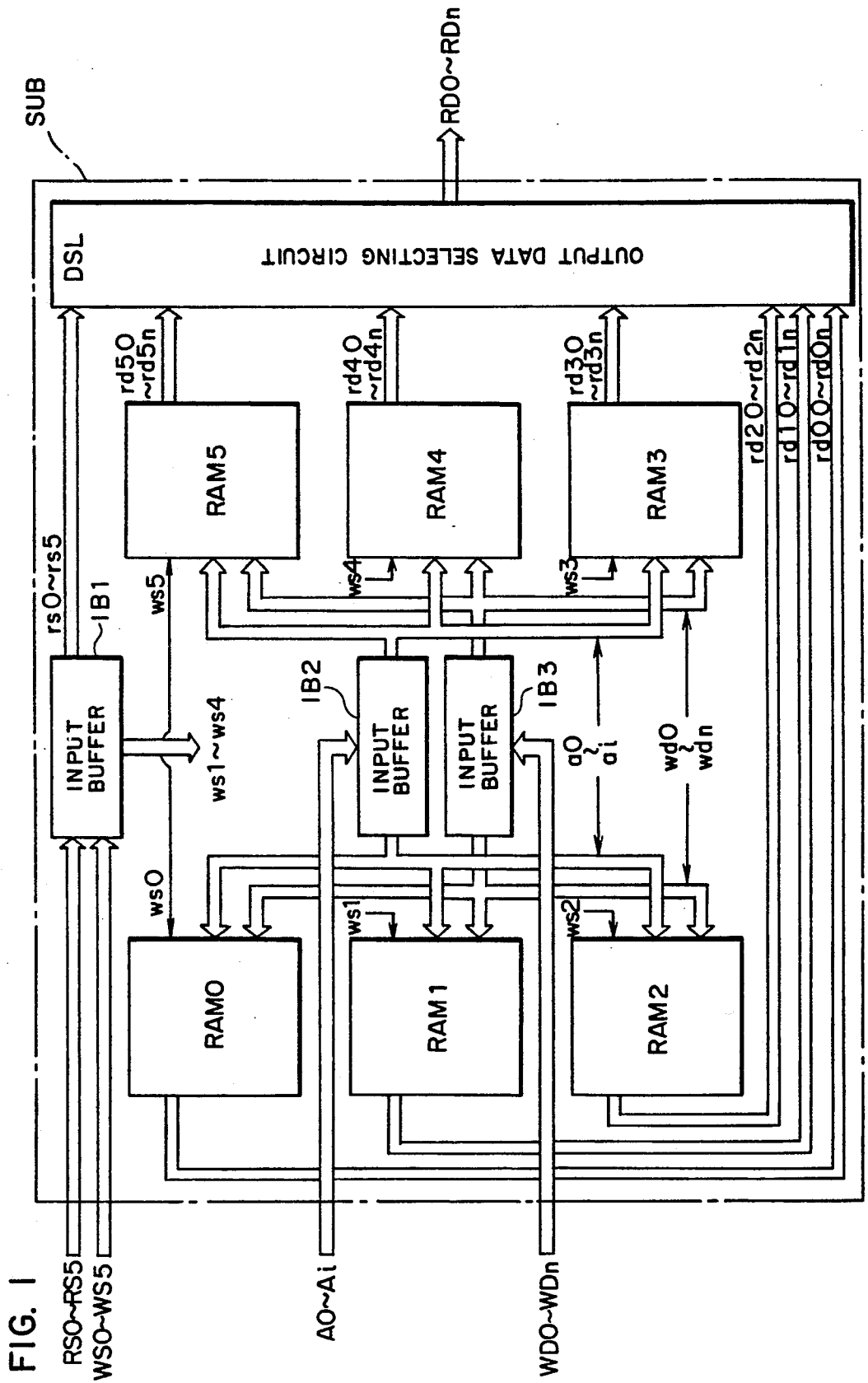
FIG. 1 is a diagram showing an ASIC memory device which has been developed by the present inventors and which is not known before application of the present invention.
Figure 2:
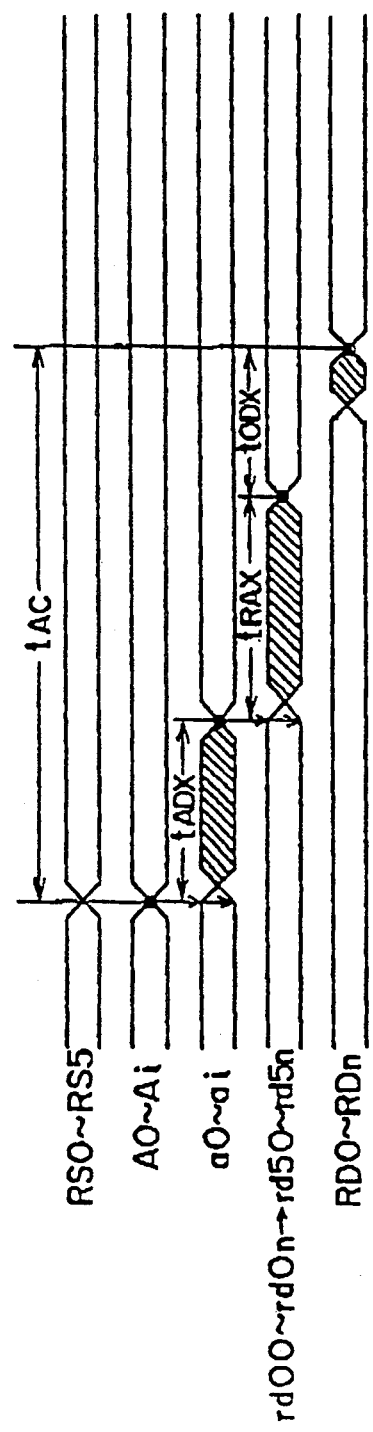
FIG. 2 is a timing diagram showing an example of a read operation of the ASIC memory device illustrated in FIG. 1.

In the ASIC memory device of this embodiment, the input buffer IB, the repeating buffers RB1 and RB2, the memory blocks RAM0-RAM5, and the output data selecting circuit DSL are successively arranged on the substrate along the logical flow of signals, i.e., the order of progress of signal processing operations as described before. As indicated by a solid line in FIG. 7, therefore, the overall propagation delay time $t_{Ds}$ in the ASIC memory device of this embodiment caused by only propagation on the signal conductor with the exception of the access time of the memory block becomes shorter as compared with that of the ASIC memory device of FIG. 1 as indicated by a broken line of FIG. 7 as the area CS of the substrate (such as a chip) of the ASIC memory device becomes larger. As a result, the access time $t_{AC}$ of the ASIC memory device is shortened by a corresponding value.

As heretofore described, the ASIC memory device of this embodiment comprises six function blocks including bipolar RAMs such as the random access memory blocks RAM0-RAM5 and one logic block such as the output data selecting circuit DSL as basic constituents. The ASIC memory device further comprises the input buffer IB for transferring the read selecting signal RS0-RS5, the write selecting signal WS0-WS5, the address signal A0-Ai, and the write data signal WD0 WDn, and the repeating buffers RB1 and RB2 for transferring the address signal A0-Ai and the write data signal WD0-WDn which have undergone propagation delay as a result of propagation on the signal conductors.

As indicated by the present embodiment heretofore described, application of the present invention to a semiconductor integrated circuit device such as an ASIC memory device comprising a plurality of random access memory blocks yields one or more of the following function effects.

(1) A plurality of random access memory blocks, a logic block, an input buffer and the like included in the ASIC memory device or the like are successively arranged on a substrate along the logical flow of signals. The plurality of random access memory blocks are successively activated beginning from random access memory blocks so located as to be the closest to the input buffer. Memory blocks activated later are so located as to be closer to the above described logic block. As a result, it becomes possible to average and compress variations in transfer time elapsing since input signals such as the address signal are inputted to the ASIC memory device until output signals of respective random access memory blocks become valid at the output node of the ASIC memory device or the like.

(2) Owing to the effect described in item (1), the overall propagation delay time within the ASIC memory device or the like caused by only signal propagation on conductors with the exception of access time of the random access memory blocks can be shortened.

(3) Owing to the effects described in items (1) and (2), the access time of the ASIC memory device or the like can be equivalently shortened.

(4) Owing to the effects described in items (1) to (3), performance of a digital system comprising an ASIC memory device or the like can be enhanced.

The invention has heretofore been specifically described on the basis of an embodiment. As a matter of course, however, the present invention is not limited to the above described embodiment, but various variations may be made without departing from the spirit of the invention.

For example, the input buffer IB, the repeating buffers (relay buffers) RB1 and RB2, the random access memory blocks RAM0-RAM5, and the output data selecting circuit DSL of FIG. 3 may be successively arranged from the top of FIG. 3 to the bottom thereof.

Figure 9:
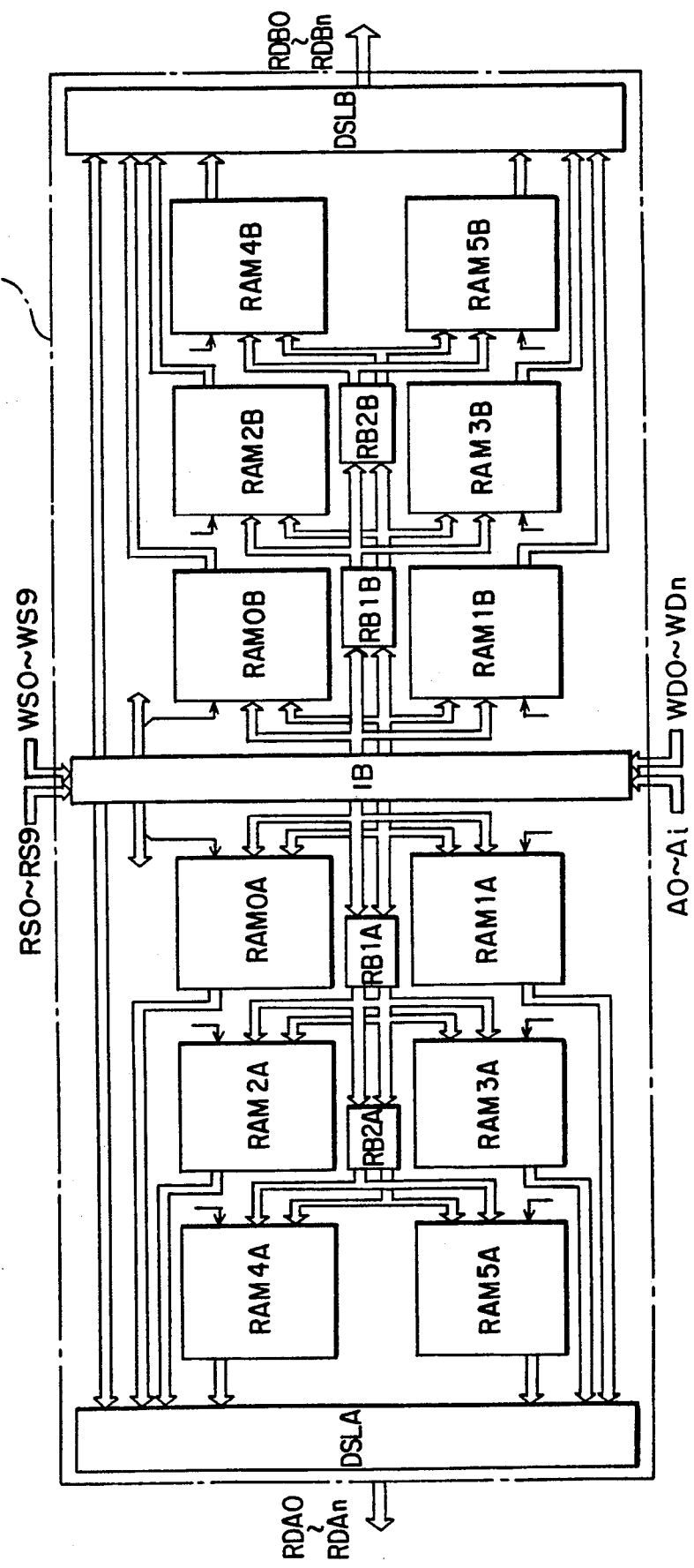
FIG. 9 is a diagram showing an ASIC memory device according to another preferred embodiment of the present invention.

Further, in case the logic circuit (output data selecting circuit) DSL can be divided and arranged at both ends of a semiconductor substrate, the structure as shown in FIG. 9 may be used. In FIG. 9, logic circuits DSLA and DSLB are located at opposite ends of the semiconductor substrate 20, and the input buffer IB is located nearly in the center of the semiconductor substrate. Between the input buffer IB and the logic circuit DSLA and between the input buffer IB and the logic circuit DSLB, random access memory blocks RAM0A-RAM5A and RAM0B-RAM5B as well as repeating buffers (relay buffers) RB1A-RB2A and RB1B-RB2B are located. Input signals such as the read selecting signal RS0-RS9, the write selecting signal WS0-WS9, the address signal A0-Ai and the write data signal WD0-WDn are supplied to the input buffer located in the center of the substrate. The input buffer IB may be divided and located for respective input signals. Or the repeating buffers RB1 and RB2 may be located together at the position of the input buffer IB.

The ASIC memory device may comprise an arbitrary number of random access memory blocks and an arbitrary number of repeating buffers. Further, the output data selecting circuit DSL used as the logic block may be replaced with a data comparing circuit for comparing read data with compare data, an adding circuit or the like. Although in this case the logic block similarly comprises a plurality of stages of logic circuits, these logic circuits may be located collectively or may be distributed among the random access memory blocks RAM0-RAM5.

In case operation of the random access memory blocks RAM0-RAM5 is not restricted by the write data WD0-WDn, these write data need not be successively delayed. In case a plurality of function blocks such as random access memory blocks are started in accordance with a start control signal such as a chip selecting signal, the plurality of function blocks can be successively activated by successively delaying the above described start control signal or the like instead of the address signal A0-Ai.

With reference to FIG. 4, the address signal A0-Ai and the write data signal WD0-WDn need not especially be converted to complementary internal signals. In this case, the inverting input terminal i of each of the buffer gate circuit G1 of FIG. 5 and the like may be supplied with a predetermined reference potential.

Further, the block structure of the ASIC memory device shown in FIG. 3, concrete circuit structure of the input buffer IB and the repeating buffers RB1 and RB2 as shown in FIGS. 4 and 6, and the combination of control signals and address signals may be replaced with various implementation forms.

The case where the present invention is applied to an ASIC memory device, which is an application field forming its background, has heretofore mainly been described. However, the present invention is not limited to the ASIC memory device, but the present invention is applicable to a wafer scale memory mounting a large number of unit memory integrated circuits and other digital integrated circuits including a plurality of function blocks, for example. The present invention can be widely applied to any semiconductor integrated circuit device comprising at least a plurality of function blocks distributed on a common semiconductor substrate.

While a preferred embodiment has been set forth with specific details, further embodiments, modifications and variations are contemplated according to the broader aspects of the present invention, all as determined by the spirit and scope of the following claims.

I claim:

1. A semiconductor integrated circuit device formed with a single semiconductor substrate, comprising:
    an input stage for receiving a first input signal and delivering at one timing a second input signal corresponding to said first input signal;
    a plurality of function blocks each electrically connected with said input stage to operate in parallel to generate an output signal responsive to said second input signal and at a plurality of different timings;
    an output stage electrically connected with said function blocks to receive the output signal of said each function block for producing a device output signal;
    said input stage, said function blocks and said output stage being in an arrangement on said signal semiconductor substrate in an order of progress of signal processing operations to be performed in the semiconductor integrated circuit device, and said function blocks being set in operation with different timing in accordance with said arrangement as caused by different propagation delays for said second input signal; and
    said arrangement being such that a sum of a first period of time taken for said second input signal propagating from said input stage to reach one function block and a second period of time taken for the output signal of said one function block propagating therefrom to said output stage is substantially the same for all of said plurality of function blocks.

2. A semiconductor integrated circuit device of claim 1, wherein:
the input stage is an input buffer for converting a first address signal as the first input signal to a second address signal as the second input signal;
the function blocks are a plurality of memory blocks each electrically connected with said input buffer so that each of the function blocks delivers an output signal responsive to said second address signal; and
the output stage is a logic circuit.

3. A semiconductor integrated circuit device of claim 2, further comprising:
at least one internal amplifier for amplifying said second address signal; and
said input buffer, said memory blocks, said at least one internal amplifier and said logic circuit being arranged on said single semiconductor substrate in an order of progress of signal processing operations to be performed in the semiconductor integrated circuit device, said memory blocks being set in operation with different timing in accordance with said arrangement order, and
said at least one internal amplifier being connected to supply said amplified second address signal to any of those of said memory blocks which are preceded by said internal amplifier as viewed in the direction of said progress of signal processing operations in the integrated circuit device so that said memory blocks preceded by said internal amplifier are connected with said input buffer through said internal amplifier.

4. A semiconductor integrated circuit device of claim 3, further comprising:
a first latch circuit for receiving a first address signal, and delivering said first address signal with a first timing to said input buffer;
a second latch circuit for receiving said device output signal and delivering said device output signal with a second timing; and
said first latch circuit, said input buffer, said memory blocks, said at least one internal amplifier, said logic circuit and said second latch circuit being arranged on said single semiconductor substrate in an order of progress of signal processing operations to be performed in the semiconductor integrated circuit device.

5. A semiconductor integrated circuit device of claim 4, wherein said arrangement is such that some of said function blocks are located a greater distance from said input stage than others of said function blocks; and further including a plurality of internal repeating amplifiers between said some function blocks and said input stage for amplifying said second input signal and said others of said function blocks being electrically connected with said input stage for transferring said second input signal without amplification.

6. A semiconductor integrated circuit device of claim 4, further including delay gates for delaying signal propagation only with respect to some of said function blocks to equalize the first period of time and the second period of time.

7. A semiconductor integrated circuit device of claim 3, further including delay gates for delaying signal propagation only with respect to some of said function blocks to equalize the first period of time and the second period of time.

8. A semiconductor integrated circuit device of claim 3, wherein said arrangement is such that some of said function blocks are located a greater distance from said input stage than others of said function blocks; and further including a plurality of internal repeating amplifiers between said some function blocks and said input stage for amplifying said second input signal and said others of said function blocks being electrically connected with said input stage for transferring said second input signal without amplification.

9. A semiconductor integrated circuit device of claim 2, further including delay gates for delaying signal propagation only with respect to some of said function blocks to equalize the first period of time and the second period of time.

10. A semiconductor integrated circuit device of claim 2, wherein said arrangement is such that some of said function blocks are located a greater distance from said input stage than others of said function blocks; and further including a plurality of internal repeating amplifiers between said some function blocks and said input stage for amplifying said second input signal and said others of said function blocks being electrically connected with said input stage for transferring said second input signal without amplification.

11. A semiconductor integrated circuit device of claim 1, further including delay gates for delaying signal propagation only with respect to some of said function blocks to equalize the first period of time and the second period of time.

12. A semiconductor integrated circuit device of claim 1, wherein said arrangement is such that some of said function blocks are located a greater distance from said input stage than others of said function blocks; and further including a plurality of internal repeating amplifiers between said some function blocks and said input stage for amplifying said second input signal and said others of said function blocks being electrically connected with said input stage for transferring said second input signal without amplification.

13. A semiconductor integrated circuit device formed with a single semiconductor substrate, comprising:
an input stage for receiving a first input signal and delivering a second input signal corresponding to said first input signal;
a plurality of function blocks each electrically connected with said input stage to operate to generate an output signal responsive to said second input signal;
an output stage electrically connected with said function blocks to receive the output signal of said each function block for producing a device output signal,
said input stage, said function blocks and said output stage being arranged on said single semiconductor substrate in an order of progress of signal processing operations to be performed in the semiconductor integrated circuit device; and
the length of a conductor for the electrical connection of any one of said function blocks with said input stage is smaller than that for the electrical connection of another one of said function blocks with said input stage, said another function block being generally located more distant from said input stage than said one function block on said single substrate so that said function blocks are brought into operation responsive to said second input signal in the ascending order of the lengths of the conductors for the electrical connection of said input stage with said function blocks.

14. A semiconductor integrated circuit device according to claim 13, in which the length of a conductor for the electrical connection of said one function block with said output stage is larger than that for the electrical connection of said another function block with said output stage, said one function block being generally more distant from said output stage than said another function block on said single substrate so that a time necessary for the output signal generated by said one function block to propagate on the conductor to reach said output stage is longer than that for the output signal generated by said another function block.

15. A semiconductor integrated circuit device according to claim 13, wherein some of said function blocks are located a greater distance from said input stage than others of said function blocks; and further including a plurality of internal repeating amplifiers between said some function blocks and said input stage for amplifying said second input signal and said others of said function blocks being electrically connected with said input stage for transferring said second input signal without amplification.

16. A semiconductor memory device formed with a single semiconductor substrate, comprising:
an input buffer for converting a first address signal to a second address signal;
a plurality of memory blocks each electrically connected with said input buffer so that each of said memory blocks delivers an output signal responsive to said second address signal;
a logic circuit electrically connected with said memory blocks to receive the output signal of said each memory block for producing a device output signal,
said input buffer, said memory blocks and said logic circuit being arranged on said single semiconductor substrate in a progressing order of signal processing operations to be performed in the semiconductor memory device;
the length of a conductor for the electrical connection of any one of said memory blocks with said input buffer is smaller than that for the electrical connection of another one of said memory blocks with said input buffer, said another memory block being generally located more distant from said input buffer than said one memory block on said single substrate so that said memory blocks are brought into operation responsive to said second address signal in the ascending order of the lengths of the conductors for the electrical connection of said input buffer with said memory blocks; and
the length of a conductor for the electrical connection of said one memory block with said logic circuit is larger than that for the electrical connection of said another memory block with said logic circuit, said one memory block being generally more distant from said logic circuit than said another memory block on said single substrate so that a time necessary for the output signal generated by said one memory block to propagate on the conductor to reach said logic circuit is longer than that for the output signal generated by said another memory block does,
whereby a sum of a first period of time taken for said second address signal propagating from said input buffer to reach one memory block and a second period of time taken for the output signal of said one memory block propagating therefrom to said logic circuit is substantially the same for all of said plurality of memory blocks.

17. A semiconductor memory device of claim 16, wherein some of said memory blocks are located a greater distance from said input buffer than others of said function blocks; and further including a plurality of internal repeating amplifiers between said some function blocks and said input buffer for amplifying said second address signal and said others of said function blocks being electrically connected with said input buffer for transferring said second address signal without amplification.

18. A semiconductor memory device formed with a single semiconductor substrate, comprising:
an input buffer for converting a first address signal to a second address signal;
a plurality of memory blocks each electrically connected with said input buffer so that each of said memory blocks delivers an output signal responsive to said second address signal;
at least one internal amplifier for amplifying said second address signal;
a logic circuit electrically connected with said memory blocks to receive the output signal of said each memory block for producing a device output signal,
said input buffer, said memory blocks, said at least one internal amplifier and said logic circuit being arranged on said single semiconductor substrate in an order of progress of signal processing operations to be performed in the semiconductor memory device, and
said at least one internal amplifier being connected to supply said amplified second address signal to any of those of said memory blocks preceded by said internal amplifier as viewed in the direction of said internal amplifier as viewed in the direction of said progress of signal processing operations in the memory device so that said memory blocks preceded by said internal amplifier are connected with said input buffer through said internal amplifier;
the length of a conductor for the electrical connection of any one of said memory blocks with said input buffer is smaller than that for the electrical connection of another one of said memory blocks with said input buffer, said another memory block being generally located more distant from said input buffer than said one memory block on said single substrate so that said memory blocks are brought into operation responsive to said second input signal in the ascending order of the lengths of the conductors for the electrical connection of said input buffer with said memory blocks; and
the length of a conductor for the electrical connection of said one memory block with said logic circuit is larger than that for the electrical connection of said another memory block with said logic circuit, said one memory block being generally more distant from said logic circuit than said another memory block on said single substrate so that a time necessary for the output signal generated by said one memory block to propagate on the conductor to reach said logic circuit is longer than that for the output signal generated by said another memory block, whereby a sum of a first period of time taken for said second address signal propagating from said input buffer to reach one memory block and a second period of time taken for the output signal of said one memory block propagating therefrom to said logic circuit is substantially the same for all of said plurality of memory blocks.

19. A semiconductor memory device according to claim 18, in which said logic circuit is an output data selecting circuit for selectively transferring the output signal of at least one of said plurality of memory blocks as said device output signal.

20. A semiconductor memory device according to claim 18, wherein some of said memory blocks are located a greater distance from said input buffer than others of said memory blocks; and further including a plurality of internal repeating amplifiers between said some memory blocks and said input buffer for amplifying said second address signal and said others of said memory blocks being electrically connected with said input buffer for transferring said second address signal without amplification.

21. A semiconductor integrated circuit device formed with a single semiconductor substrate, comprising:
a first latch circuit for receiving a first address signal, and delivering said first address signal with a first timing;
an input buffer for receiving said first address signal from said first latch circuit and converting said first address signal to a second address signal;
a plurality of memory blocks each electrically connected with said input buffer so that each of said memory blocks delivers an output signal responsive to said second address signal;
at least one internal amplifier for amplifying said second address signal;
a logic circuit electrically connected with said memory blocks to receive the output signal of said each memory block for producing a device output signal; and
a second latch circuit for receiving said device output signal and delivering said device output signal with a second timing,
said first latch circuit, said input buffer, said memory blocks, said at least one internal amplifier, said logic circuit and said second latch circuit being arranged on said single semiconductor substrate in an order of progress of signal processing operations to be performed in the semiconductor integrated circuit device, and
said at least one internal amplifier being connected to supply said amplified second address signal to any of those of said memory blocks preceded by said internal amplifier as viewed in the direction of said progress of signal processing operations in the integrated circuit device so that said memory blocks preceded by said internal amplifier are connected with said input buffer through said internal amplifier;
the length of a conductor for the electrical connection of any one of said memory blocks with said input buffer is smaller than that for the electrical connection of another one of said memory blocks with said input buffer, said another memory block being generally located more distant from said input buffer than said one memory block on said single substrate so that said memory blocks are brought into operation responsive to said second address signal in the ascending order of the lengths of the conductors for the electrical connection of said input buffer with said memory blocks; and
the length of a conductor for the electrical connection of said one memory block with said logic circuit is larger than that for the electrical connection of said another memory block with said logic circuit, said one memory block being generally more distant from said logic circuit than said another memory block on said single substrate so that a time necessary for the output signal generated by said one memory block to propagate on the conductor to reach said logic circuit is longer than that for the output signal generated by said another memory block, whereby a sum of a first period of time taken for said second address signal propagating from said input buffer to reach one memory block and a second period of time taken for the output signal of said one memory block propagating therefrom to said logic circuit is substantially the same for all of said plurality of memory blocks.

22. A semiconductor integrated circuit device according to claim 21, in which said single semiconductor substrate is a semiconductor substrate constituted by one semiconductor chip.

23. A semiconductor integrated circuit device according to claim 21, in which said single semiconductor substrate is a semiconductor substrate constituted by one semiconductor wafer.

24. A semiconductor integrated circuit device of claim 21, wherein some of said memory blocks are located a greater distance from said input buffer than others of said memory blocks; and further including a plurality of internal repeating amplifiers between said some memory blocks and said input buffer for amplifying said second address signal and said others of said memory blocks being electrically connected with said input buffer for transferring said second address signal without amplification.

25. A semiconductor integrated circuit device formed with a single semiconductor substrate, comprising:
an input stage for receiving a first input signal and delivering a second input signal corresponding to said first input signal;
a plurality of function blocks each electrically connected with said input stage to operate to generate an output signal responsive to said second input signal; and
an output stage electrically connected with said function blocks to receive the output signal of said each function block for producing a device output signal,
said input stage, said function blocks and said output stage being arranged on said single semiconductor substrate in an order of progress of signal processing operations to be performed in the semiconductor integrated circuit device so that said signals continuously propagate in a direction of said order that is always away from said input stage and toward said output stage to shorten conductor length and propagation time.

26. A semiconductor integrated circuit device of claim 25, as a semiconductor memory device, wherein:

the input stage is an input buffer for converting a first address signal as said first input signal to a second address signal as said second input signal;

the function blocks are a plurality of memory blocks each electrically connected with said input buffer so that each of said memory blocks delivers an output signal responsive to said second address signal; and said output stage is a logic circuit.

27. A semiconductor integrated circuit device of claim 26, further comprising:

at least one internal amplifier for amplifying said second address signal; and said input buffer, said memory blocks, said at least one internal amplifier and said logic circuit being arranged on said single semiconductor substrate in an order of progress of signal processing operations to be performed in the semiconductor integrated circuit device, and said at least one internal amplifier being connected to supply said amplified second address signal to only some of said memory blocks preceded by said internal amplifier as viewed in the direction of said progress of signal processing operations in the memory device so that a corresponding some of said memory blocks preceded by said internal amplifier are connected with said input buffer through said internal amplifier.

28. A semiconductor integrated circuit device of claim 27, further comprising:

a first latch circuit for receiving a first address signal, and delivering said first address signal with a first timing to said input buffer;

a second latch circuit for receiving said device output signal and delivering said device output signal with a second timing; and said first latch circuit, said input buffer, said memory blocks, said at least one internal amplifier, said logic circuit and said second latch circuit being arranged on said single semiconductor substrate in an order of progress of signal processing operations to be performed in the semiconductor integrated circuit device.

29. A semiconductor integrated circuit device according to claim 28, in which said single semiconductor substrate is a semiconductor substrate constituted by one semiconductor chip.

30. A semiconductor integrated circuit device according to claim 28, in which said single semiconductor substrate is a semiconductor substrate constituted by one semiconductor wafer.

31. A semiconductor integrated circuit device formed with a single semiconductor substrate, comprising:

an input stage for receiving a first input signal and delivering at one timing a second input signal corresponding to said first input signal;

a plurality of function blocks each electrically connected with said input stage to operate in parallel to generate an output signal responsive to said second input signal and at a plurality of different timings;

an output stage electrically connected with said function blocks to receive the output signal of said each function block for producing a device output signal;

a plurality of different length first electrical conductors electrically connected between said input stage and respective ones of said function blocks for transmitting said second input stage; and a plurality of repeating amplifier buffers in some of said conductors that are longer than others of said conductors, and the others of said conductors being electrically connected between said input stage and a corresponding one of said function blocks to transmit the second input signal without amplification.

32. A semiconductor integrated circuit device of claim 31, further including a plurality of second conductors of different length respectively electrically connected between said output stage and respective ones of said plurality of function blocks to transmit said output signal; and the second electrical conductors that are connected to said some function blocks being of a shorter length than the second electrical conductors connected to said other function blocks for averaging, equalizing and compressing variations of propagation time of the signals from said input stage to said output stage.

33. A semiconductor integrated circuit device of claim 32, wherein:

the input stage is an input buffer for converting a first address signal to a second address signal;

the function blocks are a plurality of memory blocks each electrically connected with said input buffer so that each of them delivers an output signal responsive to said second address signal; and said output stage is a logic circuit.

34. A semiconductor integrated circuit device of claim 31, wherein each repeating amplifier buffer is arranged on the single semiconductor substrate to be sandwiched between and directly electrically connected to at least two of said some of said function blocks.

35. A semiconductor integrated circuit device of claim 34, further including a plurality of second conductors of different length respectively electrically connected between said output stage and respective ones of said plurality of function blocks to transmit said output signal; and the second electrical conductors that are connected to said some function blocks being of a shorter length than the second electrical conductors connected to said other function blocks for averaging, equalizing and compressing variations of propagation time of the signals from said input stage to said output stage.

36. A semiconductor integrated circuit device of claim 35 wherein:

the input stage is an input buffer for converting a first address signal as the first input signal to a second address signal as the second input signal;

the function blocks are a plurality of memory blocks each electrically connected with said input buffer so that each of said function blocks delivers an output signal responsive to said second address signal; and said output stage is a logic circuit.

37. A semiconductor integrated circuit device of claim 34, wherein:

the input stage is an input buffer for converting a first address signal as said first input signal to a second address signal as said second input signal;

the function blocks are a plurality of memory blocks each electrically connected with said input buffer so that each of said function blocks delivers an output signal responsive to said second address signal; and said output stage is a logic circuit.

38. A semiconductor integrated circuit device of claim 31, wherein:

the input stage is an input buffer for converting a first address signal as said first input signal to a second address signal as said second input signal;

the function blocks are a plurality of memory blocks each electrically connected with said input buffer so that each of said memory blocks delivers an output signal responsive to said second address signal; and said output stage is a logic circuit.

* * * * *